METHOD FOR MAKING HIGH-GAIN TRANSISTORS

Filed Aug. 2, 1971

3,817,794
METHOD FOR MAKING HIGH-GAIN TRANSISTORS

William Edgar Beadle, Wilshire, and Milton Luther Embree, Larry Gene McAfee, and Stanley Floyd Moyer, Reading, Pa., assignors to Bell Telephone Laboratories, Incorporated, Murray Hill, N.J.

Filed Aug. 2, 1971, Ser. No. 168,034
Int. Cl. H01l 7/54
U.S. Cl. 148—1.5 6 Claims

ABSTRACT OF THE DISCLOSURE

A high-gain, low-noise, high-frequency transistor is made simultaneously with a conventional transistor on a common substrate. A low conductivity base region is first diffused into only a high-gain transistor portion. A high conductivity region diffused into both transistors constitutes the active base region for the conventional transistor and ohmic base contacts for the high-gain transistor; the ohmic contacts also delimit the extent of the high-gain transistor active base region.

BACKGROUND OF THE INVENTION

This relates to methods for making semiconductor devices, and more particularly, to methods for making a high-gain, low-noise, high-frequency transistor on a common semiconductor substrate with a conventional transistor.

Conventional planar transistors used as amplifiers have a typical current gain (beta) of 40–150, which is sufficient for most purposes. Some systems, however, require preamplifiers capable of amplifying, with high gain and low noise, extremely low power high-frequency input signals; and for such purposes, it would be desirable to provide a low-noise transistor with a current gain on the order of 1000 for preliminary amplification prior to amplification by a conventional transistor.

Such high-gain transistors require a relatively high resistivity base layer for a low emitter-to-base voltage drop and high emitter efficiency. Secondly, the area of the emitter-base junction should be small for low current gain peaking. Additionally, the base width must be precisely controlled and low resistance ohmic contacts to the high resistivity region must be provided.

A high-gain transistor of this type is incapable of amplifying high input power levels and is therefore suitable primarily as a preamplifier; as such, it must almost invariably be followed in its circuit by a conventional amplifier for providing additional amplification.

With the widespread use of monolithic integrated circuits, the advantages of forming a number of circuit components in a common semiconductor substrate have become well recognized, and it would plainly be desirable to form conventional transistors on a common semiconductor substrate with high-gain transistors. Such integration has not been feasible, however, because of incompatible device requirements. While at first glance it might theoretically appear to be possible to form a high-gain transistor on a wafer, mask the high-gain transistor and form a conventional transistor on a different portion of the same wafer, such a process is nearly impossible in practice because the diffusion steps in the conventional transistor portion necessarily cause increased diffusion and other disruptions in the neighboring high-gain transistor portion of the wafer.

SUMMARY OF THE INVENTION

It is an object of this invention to provide a process for fabricating a high-gain transistor.

More specifically, it is an object of this invention to provide a process for forming a high-gain, low-noise, high-frequency transistor on a common semi-conductor wafer substrate with a conventional transistor.

These and other objects of the invention are attained in an illustrative embodiment thereof in which a high-gain transistor and a conventional transistor are simultaneously formed on a common semiconductor substrate. An N-type collector layer is first epitaxially grown over the entire surface of a P-type substrate. The collector layer is then suitably masked so that a high resistivity P-type base region is diffused only into a high-gain transistor portion. A mid-portion of the high-gain transistor base region is then masked, after which a low resistivity P-type diffusion is made into both transistor portions. The low resistivity diffusion into the conventional transistor portion constitutes the base region of that transistor, while the low resistivity diffusion into the high-gain transistor portion creates ohmic contacts for the active base region that is masked. Next, after suitable masking, N+ emitter regions are simultaneously diffused into both transistor portions which overlay the respective base regions.

In the finished device, the active base region of the high-gain transistor is a high resistivity P-type region bounded by the N-type collector, the emitter, and the low resistivity P-type ohmic contacts. As will be explained later, the lateral diffusion during formation of the ohmic contacts constricts the active base region to give a low area emitter-base junction as is required for such devices. The conventional transistor is made by the conventional method, but yet in a manner compatible with the formation of the high-gain transistor.

Other semiconductor devices, along with the appropriate metal contacts and interconnections can, of course, be made in accordance with known techniques to give any of a number of desired finished integrated circuits in accordance with the invention. These and other objects, features, and advantages of the invention will be better understood from a consideration of the following detailed description taken in connection with the accompanying drawing.

DRAWING DESCRIPTION

DETAILED DESCRIPTION

Figure 1:
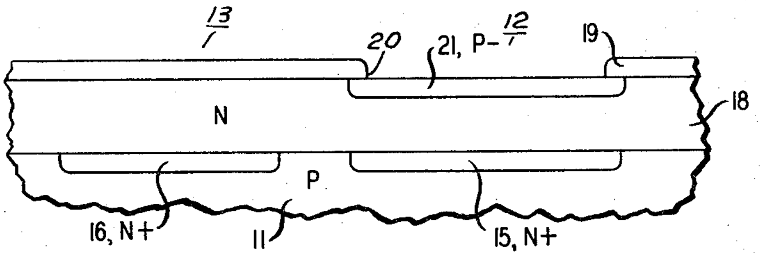
FIG. 1 is a schematic view of part of a semiconductor wafer illustrating one step of a process for making conventional and high-gain transistors on a common substrate in accordance with one embodiment of the invention.

Referring now to FIG. 1, there is shown part of a P-type substrate 11 upon which it is desired to form both a high-gain transistor on one portion 12 and a conventional transistor on another portion 13. In accordance with an illustrative embodiment of the invention, this is accomplished first by diffusing N+ regions 15 and 16 into both the high-gain transistor and conventional transistor portions of the substrate 11. Next, an N-type epitaxial layer, which will eventually constitute a collector region 18, is grown over the entire surface of the wafer 11. A mask 19 is formed over the entire collector region 18 with a base region window 20 being formed in the high-gain transistor portion. A high resistivity P-type base region 21 is then formed by diffusion only in the high-gain transistor portion.

Figure 2:
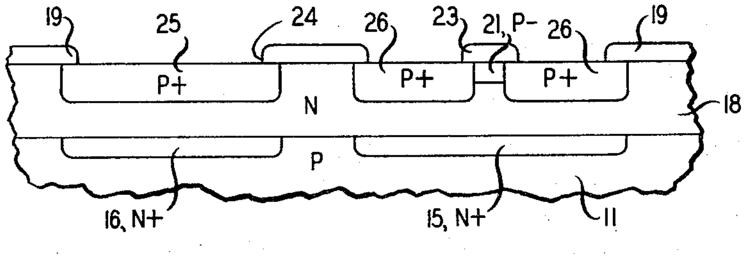
FIGS. 2 through 4 are views of the wafer of FIG. 1 illustrating successive steps of the process.

Referring to FIG. 2, a mid-portion of the base region 21 is masked by a mask layer 23. The remainder of the upper surface continues to be masked by mask 19, except that a base window 24 is formed in the conventional transistor portion 13. Next, a high conductivity diffusion is made into the exposed or unmasked parts of the wafer such as to form low resistivity P+ region 25 in the conventional transistor portion and low resistivity P+ regions 26 in the high-gain transistor portion. Region 25 will eventually constitute the base of the conventional transistor, while regions 26 of portion 12 will eventually constitute ohmic contacts to the active base 21 of the high-gain transistor.

Figure 3:
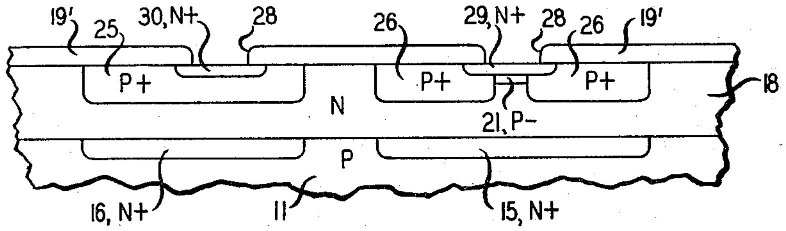

Referring to FIG. 3, the entire upper surface of the semiconductor is again masked with a mask layer 19′, in which emitter windows 28 are formed. Low resistivity N+ emitter regions 29 and 30 are then formed by diffusion in both the high-gain and conventional transistor portions. The emitter window of the high-gain transistor portion is, of course, suitably located such that the emitter region 29 overlays and forms a suitable junction with the active base region 21.

Figure 4:
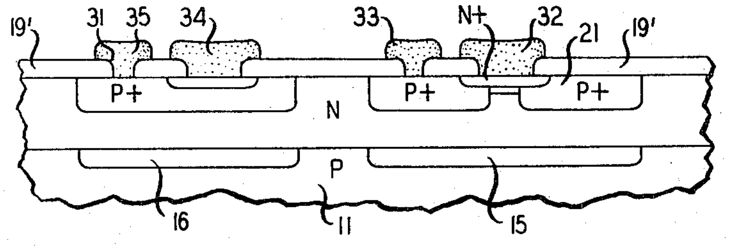

Referring to FIG. 4, base contact windows 31 are then made in the mask layer 19′, and the wafer surface is metallized and etched to give suitable emitter and base contacts 32 to 33 to the high-gain transistor and emitter and base contacts 34 and 35 to the conventional transistor. Appropriate metal collector contacts are, of course, made to the collector contact regions 15 and 16 in a known manner to give two operative transistor structures on a common substrate.

Notice that, while the high-gain transistor has been made simultaneously with, and on a common substrate with, a conventional transistor, its parameters meet all of the known requirements for giving a high current gain (beta) along with high-frequency and low-noise capabilities—that is, the active base region 21 has a high resistivity; the base width is small and can be precisely controlled; the area of the emitter-base junction is small; and low-resistance ohmic contacts are provided to the high resistivity active base region. While these parameters are significantly different from that of the conventional transistor, the foregoing has demonstrated that its fabrication is compatible with conventional transistor fabrication. A key step of the inventive process is, of course, that illustrated in FIG. 2 in which the conventional transistor base layer 25 and the ohmic contacts 26 for the high-gain transistor are formed simultaneously. The ohmic contact diffusion not only provides a low resistance contact to the active base region 21, necessary for low-noise and high-frequency performance, but it defines the lateral extent of the active base region 21. That is, the lateral diffusion beneath mask 23 of ohmic contact regions 26 determine opposite boundaries of the active base region 21 and thereby permit the formation of a much smaller area emiter-base junction than would otherwise be possible. These ohmic contact regions also suppress the injection of minority carriers from the emitter at the emitter periphery which are typically lost in other devices to surface or bulk recombinations. The high conductivity ohmic contact regions 26 effectively restrict emitter current to the high resistivity base region 21, thereby maximizing efficiency. The suppression of surface recombination by the P+ diffusion also improves low frequency noise performance.

The various steps described all comprise known silicon integrated circuit techniques. The wafer is preferably silicon, with the various masks being of silicon-dioxide in which the various windows can be very accurately formed by known photolithographic masking and etching. The base region 21 of FIG. 1 is preferably made by ion implantation of a $1\times10^{13}/\text{cm.}^2$ dose of boron at an energy of 20–50 KEV. This implantation is then redistributed by a 1200° C. diffusion for two to three hours with a boron cap covering the exposed semiconductor to contain the implanted impurity. This gives an appropriate low carrier concentration for a high resistivity base layer 21 having a sheet resistance of approximately 2000 ohms per square. The diffused regions 25 and 26, on the other hand, may have a sheet resistance of 200 ohms per square, as is conventional in the silicon integrated circuit art. The emitter may have a typical sheet resistance of 4 ohms per square and a depth of 1.6 microns. Since only the junction of the emitter region with base region 21 of the high-gain transistor will be electrically active, the actual diffused emitter area can be made as large as practical to facilitate fabrication; whereas in normal high-gain transistor production, the emitter region is made extremely small to minimize the area of the emitter-base junction.

Figure 5:
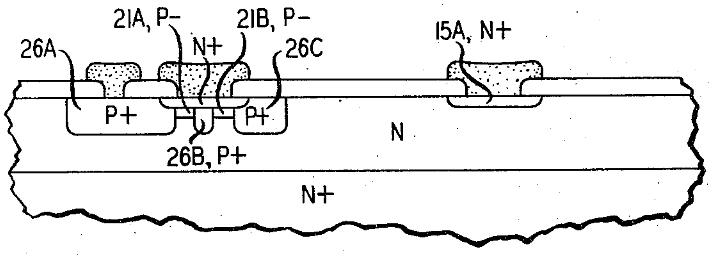
FIG. 5 is a view of part of a semiconductor wafer illustrating a process for making conventional and high-gain transistors on a common substrate in accordance with another embodiment of the invention.

This latter characteristic can be put to further advantage in that it permits the formation of a dual high-gain transistor, as illustrated in FIG. 5. It is clear from the previous discussion that the active base region may be masked so as to permit the formation of three ohmic contact regions 26A, 26B, and 26C. This, in turn, defines two active base regions 21A and 21B, shown in FIG. 5, rather than the single active base region of FIG. 4. The two active base regions 21A and 21B define single stripe high-gain transistors. This concept can be extended to include many such emitter stripes, thus increasing power handling capabilities of the device. The accompanying reduction in base resistance also improves noise performance and increases the high frequency capabilities of the device. The dual high-gain transistor is, of course, as compatible with conventional transistor fabrication as is the embodiment of FIG. 4. FIG. 5 also shows the collector contact 15A located on the upper surface of the device merely to illustrate that the collector contact need not be buried as illustrated previously.

It should be recognized that the structure described here provides in addition to high gain, other significant device capabilities. These include improved noise performance due to the combination of high gain, low base contact resistance and reduced base surface recombination velocity. Furthermore, the reduced base contact resistance in conjunction with the technique of limiting the emitter area provides significant improvement in the transistor's high frequency performance.

While the specific embodiments described have included conventional striped geometries, epitaxy, ion implantation, and diffusion, it is to be understood that other known alternatives could also be used. Also, the device may be made of materials other than silicon, and conductivities complementary to those illustrated may alternatively be used. Various other embodiments and modifications may be made by those skilled in the art without departing from the spirit and scope of the invention.

What is claimed is:

1. A method for making a high-gain transistor on a common semiconductor substrate with a conventional transistor comprising the steps of:

forming on the substrate a collector region of a first conductivity type;

forming on a high-gain transistor portion of the collector region a relatively high resistivity first base region of a second conductivity type;

masking a mid-portion of the first base region;

simultaneously forming on the collector region of a conventional transistor portion and on an unmasked part of the first base region of the high-gain transistor portion a relatively low resistivity region of said second conductivity type, such region constituting a second base region in the conventional transistor portion, and on ohmic contact region in the high-gain transistor portion, said ohmic contact region contacting the masked mid-portion of the first base region which constitutes the base of the high-gain transistor portion; and simultaneously forming emitter regions of the first conductivity type on the conventional transistor portion and the high-gain transistor portion, one overlaying the first base region and the other overlaying the second base region.

2. The method of claim 1 wherein:

the ohmic contact region of the high-gain transistor portion is formed to a depth that exceeds the depth of the first base region, whereby the boundaries of the active base region of the high-gain transistor are defined by the ohmic contact region.

3. The method of claim 2 wherein:

the ohmic contact region of the high-gain transistor portion is formed by diffusion, whereby lateral diffusion beneath the masked mid-portion of the first base region defines the lateral extent of the first base region, thus permitting the formation of an extremely small area active base-emitter junction as is required for very high-gain transistor operation.

4. The method of claim 3 wherein:

the collector region is formed by epitaxially growing a semiconductor layer of the first conductivity type on the substrate; and the first base region is formed by ion implantation into the collector region of impurities of the second conductivity type, with subsequent diffusion of the impurities.

5. The method of claim 4 further comprising the step of diffusing low resistivity collector contact regions in the high-gain transistor portion and the conventional transistor portion of the common semiconductor substrate prior to the formation of said epitaxial collector regions.

6. The method of claim 1 wherein:

the step of masking the first base region comprises the step of masking parallel stripes of the first base region; and the step of forming the emitter regions comprises the step of forming the emitter region that overlays both of said first base region stripes.

References Cited

UNITED STATES PATENTS

| | | | |
|---|---|---|---|
| 3,582,725 | 6/1971 | Matakura et al. | 317—235 |
| 3,655,457 | 4/1972 | Duffy et al. | 148—1.5 |
| 3,380,153 | 4/1968 | Husher et al. | 29—577 |

L. DEWAYNE RUTLEDGE, Primary Examiner

U.S. Cl. X.R.

29—574; 148—187; 317—235